United States Patent
Nomura et al.

(10) Patent No.: US 9,571,072 B2
(45) Date of Patent: Feb. 14, 2017

(54) FREQUENCY MULTIPLICATION CIRCUIT, ELECTRONIC DEVICE AND MOVING OBJECT

(71) Applicant: Seiko Epson Corporation, Tokyo (JP)

(72) Inventors: Masataka Nomura, Minowa (JP); Akira Nakada, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/806,051

(22) Filed: Jul. 22, 2015

(65) Prior Publication Data

US 2016/0028384 A1    Jan. 28, 2016

(30) Foreign Application Priority Data

Jul. 23, 2014   (JP) ................................ 2014-149606

(51) Int. Cl.
*H03K 5/06*       (2006.01)
*H03K 5/00*       (2006.01)

(52) U.S. Cl.
CPC ................................ *H03K 5/00006* (2013.01)

(58) Field of Classification Search
CPC .... H03K 5/00006; H03K 3/012; H03K 3/037; H03K 3/017; H03K 5/133; H03K 5/135; H03K 5/1254; H03K 5/159
USPC .................. 327/113, 114, 116, 117
See application file for complete search history.

(56) References Cited

U.S. PATENT DOCUMENTS 5,963,071 A * 10/1999 Dowlatabadi ...... H03K 5/00006
                                                            327/116

FOREIGN PATENT DOCUMENTS

| JP | 01-319321 A | 12/1989 |
| JP | 07-022919 A | 1/1995 |
| JP | 07-086882 A | 3/1995 |
| JP | 09-232871 A | 9/1997 |

* cited by examiner

*Primary Examiner* — John Poos
(74) *Attorney, Agent, or Firm* — Harness, Dickey & Pierce, P.L.C.

(57) ABSTRACT

A frequency multiplication circuit includes a delay circuit that has a clock signal having a period input thereto and delays the signal by a time, an exclusive OR circuit that has the clock signal and a signal from the delay circuit input thereto and outputs a signal serving as an exclusive OR between the clock signal and the signal from the delay circuit, and a signal correction circuit that has a signal from the exclusive OR circuit input thereto and corrects the input signal to output the resultant. The length of the time is a length other than n×T/4 (n is an integer). The signal correction circuit attenuates a signal having a second frequency based on T/2, rather than a signal having a first frequency based on the time τ.

16 Claims, 8 Drawing Sheets

FREQUENCY MULTIPLICATION CIRCUIT, ELECTRONIC DEVICE AND MOVING OBJECT

BACKGROUND

1. Technical Field

The present invention relates to a frequency multiplication circuit, an electronic device and a moving object.

2. Related Art

A clock signal generated from an oscillation signal which is output by an oscillation circuit is used in various products. When a high-frequency clock signal is generated, a frequency multiplication circuit that multiplies the frequency of an oscillation signal is used.

JP-A-7-22919 discloses a frequency multiplier using a delay circuit and a circuit that outputs an exclusive OR.

In the frequency multiplier disclosed in JP-A-7-22919, since multiple stages of delay circuits and circuits that output an exclusive OR have to be used in order to apply a multiplication number larger than 2-multiplication, there is the possibility of a circuit configuration being complicated.

SUMMARY

An advantage of some aspects of the invention is to provide a frequency multiplication circuit, an electronic device and a moving object which are capable of multiplying a frequency with a simple configuration.

The invention can be implemented as the following forms or application examples.

Application Example 1

This application example is directed to a frequency multiplication circuit including: a delay circuit that has a clock signal having a period T input thereto, and outputs a signal obtained by delaying a phase of the clock signal by a time $\tau$; an exclusive OR circuit that outputs a signal obtained by performing an exclusive OR between the clock signal and the delayed signal; and a signal correction circuit that has a signal from the exclusive OR circuit input thereto, outputs a required frequency component by correcting the input signal, and attenuates an unnecessary frequency component.

Application Example 2

In this application example, a length of the time $\tau$ may be a length other than $n \times T/4$ (n is an integer), and the signal correction circuit may attenuate a signal having a second frequency based on T/2, rather than a signal having a first frequency based on the time $\tau$.

The signal having a first frequency based on the time $\tau$ is a signal in which $1/(2 \times \tau)$ is used as a first frequency. The signal having a second frequency based on T/2 is a signal in which 2/T is used as a second frequency.

According to this application example, since a component having a second frequency which is an unnecessary frequency component is attenuated by the signal correction circuit, it is possible to obtain an output signal having a first frequency. Therefore, it is possible to implement a frequency multiplication circuit capable of multiplying a frequency with a simple configuration.

Application Example 3

In this application example, the signal correction circuit may include a filter circuit that passes the signal having a first frequency and attenuates the signal having a second frequency.

According to this application example, since the filter circuit that passes the signal having a first frequency and attenuates the signal having a second frequency is included, it is possible to obtain an output signal having a first frequency. Therefore, it is possible to implement a frequency multiplication circuit capable of multiplying a frequency with a simple configuration.

Application Example 4

In this application example, the signal correction circuit may include a first series circuit, having a first inductor and a first capacitance circuit connected in series to each other, which is connected between a signal line through which the signal from the exclusive OR circuit is transmitted and a reference potential.

According to this application example, since the signal having a second frequency can be attenuated, for example, by the series resonance frequency of the first series circuit being set to the second frequency, it is possible to obtain an output signal having a first frequency. Therefore, it is possible to implement a frequency multiplication circuit capable of multiplying a frequency with a simple configuration.

Application Example 5

In this application example, the first capacitance circuit may include a variable capacitive element.

According to this application example, since a frequency capable of being attenuated can be adjusted, it is possible to change the frequency characteristics of the signal correction circuit, for example, in accordance with the frequency of the clock signal. Therefore, it is possible to implement a frequency multiplication circuit capable of multiplying a frequency with a simple configuration.

Application Example 6

In this application example, a first correction signal generation circuit that generates a first control signal based on T/2 may be further included, and a capacitance value of the first capacitance circuit may be controlled on the basis of the first control signal.

According to this application example, it is possible to change the frequency characteristics of the signal correction circuit in accordance with the frequency of the clock signal. Therefore, it is possible to implement a frequency multiplication circuit capable of multiplying a frequency with a simple configuration.

Application Example 7

In this application example, a second capacitance circuit which is connected in parallel to the first series circuit may be further included.

According to this application example, since the signal having a first frequency can be passed, for example, by the parallel resonance frequencies of the first inductor and the second capacitance circuit of the first series circuit being set to the first frequency, it is possible to obtain an output signal having a first frequency. Therefore, it is possible to implement a frequency multiplication circuit capable of multiplying a frequency with a simple configuration.

Application Example 8

In this application example, the second capacitance circuit may include a variable capacitive element.

According to this application example, since a frequency capable of being passed can be adjusted, it is possible to change the frequency characteristics of the signal correction circuit, for example, in accordance with the length of the time $\tau$. Therefore, it is possible to implement a frequency multiplication circuit capable of multiplying a frequency with a simple configuration.

Application Example 9

In this application example, a second correction signal generation circuit that generates a second control signal based on the time $\tau$ may be further included, and a capacitance value of the second capacitance circuit may be controlled on the basis of the second control signal.

According to this application example, it is possible to change the frequency characteristics of the signal correction circuit in accordance with the length of the time $\tau$. Therefore, it is possible to implement a frequency multiplication circuit capable of multiplying a frequency with a simple configuration.

Application Example 10

In this application example, a waveform shaping circuit that shapes a signal from the signal correction circuit into a square wave may be further included, the signal correction circuit may include a multiplication signal correction portion, and the multiplication signal correction portion is supplied with a signal in which pulses having a pulse width $\tau 1$ on a time axis are periodically arranged with a period T/m (m≠2), and the pulse width $\tau 1$ and the period T/m satisfy a relation of $\tau 1/(T/m) \neq 0.5$, and attenuates at least one of signals having a fourth frequency based on at least one of the pulse width $\tau 1$ and a pulse width $T/m-\tau 1$, rather than a signal having a third frequency based on the period T/m (m≠2).

The signal having a third frequency based on T/m is a signal in which m/T is set to the third frequency. The signal having a fourth frequency based on the time width of the pulse width $\tau 1$ is a signal in which $1/(2 \times \tau 1)$ is set to the fourth frequency. The signal having a fourth frequency based on the time width of $T/m-\tau 1$ is a signal in which $1/(2 \times (T/m-\tau 1))$ is set to the fourth frequency.

According to this application example, since a component having a fourth frequency which is an unnecessary frequency component is attenuated by the multiplication signal correction portion, it is possible to obtain an output signal having a third frequency which has an improvement in duty ratio. Therefore, it is possible to implement a frequency multiplication circuit capable of improving a duty ratio with a simple configuration.

Application Example 11

In this application example, the multiplication signal correction portion may include a second series circuit, having a second inductor and a third capacitance circuit connected in series to each other, which is connected between a signal line through which the signal from the exclusive OR circuit is transmitted and a reference potential.

According to this application example, since the signal having a fourth frequency can be attenuated, for example, by the series resonance frequency of the second series circuit being set to the fourth frequency, it is possible to obtain an output signal having a third frequency which has an improvement in duty ratio. Therefore, it is possible to implement a frequency multiplication circuit capable of improving a duty ratio with a simple configuration.

Application Example 12

In this application example, the third capacitance circuit may include a variable capacitive element.

According to this application example, since a frequency capable of being attenuated can be adjusted, it is possible to change the frequency characteristics of the signal correction circuit, for example, in accordance with a shift in the duty ratio of the output signal of the waveform shaping circuit or the multiplication circuit portion of the signal correction circuit. Therefore, it is possible to implement a frequency multiplication circuit capable of improving a duty ratio with a simple configuration.

Application Example 13

In this application example, a third correction signal generation circuit that generates a third control signal based on at least one of the pulse widths $\tau 1$ and $T/m-\tau 1$ may be further included, and a capacitance value of the third capacitance circuit may be controlled on the basis of the third control signal.

According to this application example, it is possible to change the frequency characteristics of the signal correction circuit in accordance with a shift in the duty ratio of the output signal of the waveform shaping circuit or a shift in the duty ratio of the signal which is output from the multiplication circuit portion. Therefore, it is possible to implement a frequency multiplication circuit capable of improving a duty ratio with a simple configuration.

Application Example 14

This application example is directed to an electronic device including any of the frequency multiplication circuits described above.

Application Example 15

This application example is directed to a moving object including any of the frequency multiplication circuits described above.

According to the electronic device and the moving object, since the frequency multiplication circuit capable of multiplying a frequency with a simple configuration can be included, it is possible to implement an electronic device and a moving object with a simple configuration.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments of the invention will be described in detail with reference to the accompanying drawings. The drawings used herein are for convenience of description. Meanwhile, the embodiments described below are not unduly limited to the disclosure of the invention described in the appended claims. In addition, all the configurations described below are not necessarily essential components of the invention.

1. Frequency Multiplication Circuit

1-1. First Embodiment

Figure 1:
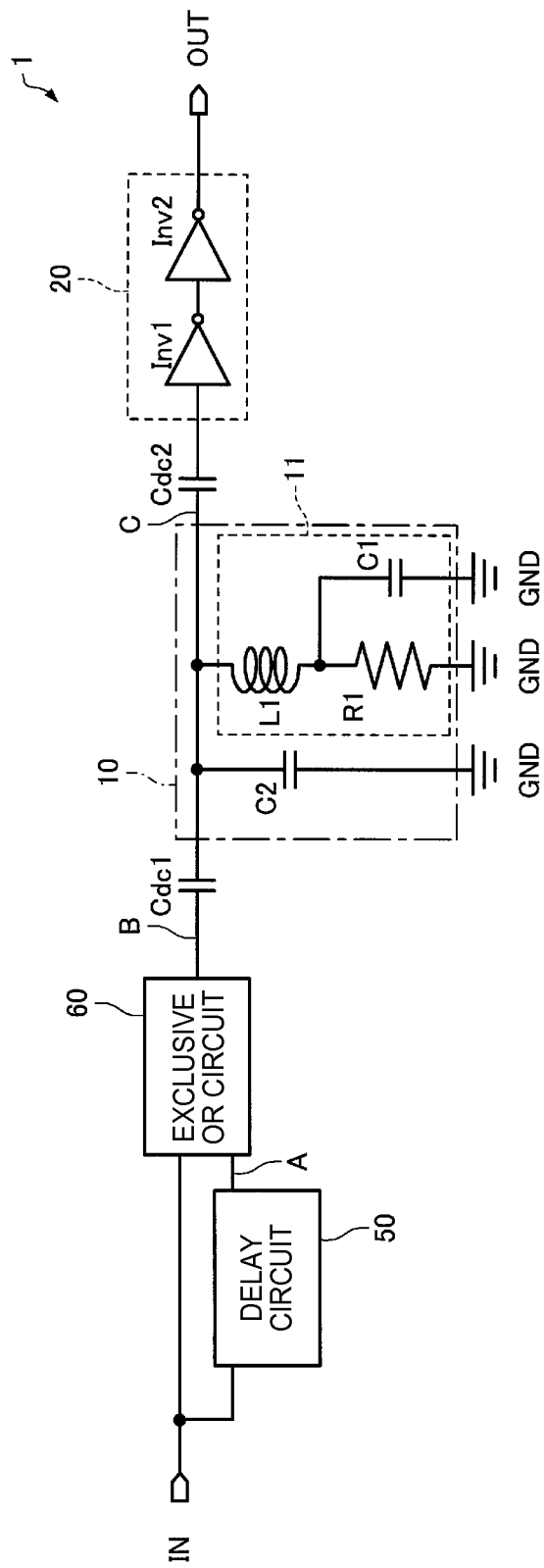
FIG. 1 is a circuit diagram of a frequency multiplication circuit according to a first embodiment.

FIG. 1 is a circuit diagram of a frequency multiplication circuit 1 according to a first embodiment.

The frequency multiplication circuit 1 according to the present embodiment includes a delay circuit 50, an exclusive OR circuit 60, and a signal correction circuit 10. In an example shown in FIG. 1, the frequency multiplication circuit 1 further includes a waveform shaping circuit 20.

The delay circuit 50 has a clock signal having a period T input thereto, and delays the signal by a time $\tau$. In the example shown in FIG. 1, a clock signal which is input from an input terminal IN is input to the delay circuit 50. The delay circuit 50 outputs the delayed signal to the exclusive OR circuit 60.

The exclusive OR circuit 60 has the clock signal and a signal from the delay circuit 50 input thereto, and outputs a signal serving as an exclusive OR between the clock signal and the signal from the delay circuit 50. In the example shown in FIG. 1, as the clock signal, a clock signal which is input from the input terminal IN is input to the exclusive OR circuit 60. The exclusive OR circuit 60 outputs an output signal to the signal correction circuit 10.

The signal correction circuit 10 has a signal from the exclusive OR circuit 60 input thereto, and corrects the input signal to output the resultant. In the example shown in FIG. 1, the signal from the exclusive OR circuit 60 is input to the signal correction circuit 10 through a capacitive element Cdc1. The signal correction circuit 10 outputs the corrected signal to the waveform shaping circuit 20 through a capacitive element Cdc2. The capacitive element Cdc1 and the capacitive element Cdc2 function as DC-cut capacitors that remove a direct-current component.

In the example shown in FIG. 1, the signal correction circuit 10 includes a first series circuit 11 constituted by a first inductor L1 and a first capacitance circuit C1 which is connected between a signal line through which a signal is transmitted and a reference potential. The first series circuit 11 is a serial resonance circuit having a series resonance frequency. In addition, the first series circuit 11 further includes a resistor R1 which is connected in parallel to the first capacitance circuit C1. The reference potential in the present embodiment is a ground potential GND. Meanwhile, the first capacitance circuit C1 may be constituted by one or more electrostatic capacitive elements having a constant capacitance value or one or more variable capacitive elements having a variable capacitance, and may be configured by combining these elements.

In the example shown in FIG. 1, the signal correction circuit 10 further includes a second capacitance circuit C2 which is connected in parallel to the first series circuit 11. The first inductor L1 of the first series circuit 11 and the second capacitance circuit C2 constitute a parallel resonance circuit having a parallel resonance frequency. Meanwhile, the second capacitance circuit C2 may be constituted by one or more electrostatic capacitive elements having a constant capacitance value or one or more variable capacitive elements having a variable capacitance, and may be configured by combining these elements.

The waveform shaping circuit 20 shapes a signal from the signal correction circuit 10 into a square wave. In the example shown in FIG. 1, the waveform shaping circuit 20 includes an inverter Inv1 and an inverter Inv2 which are connected in series to each other. An output signal of the signal correction circuit 10 is input to the waveform shaping circuit 20 through the capacitive element Cdc2, and the shaped signal is output to an output terminal OUT.

Figure 2:
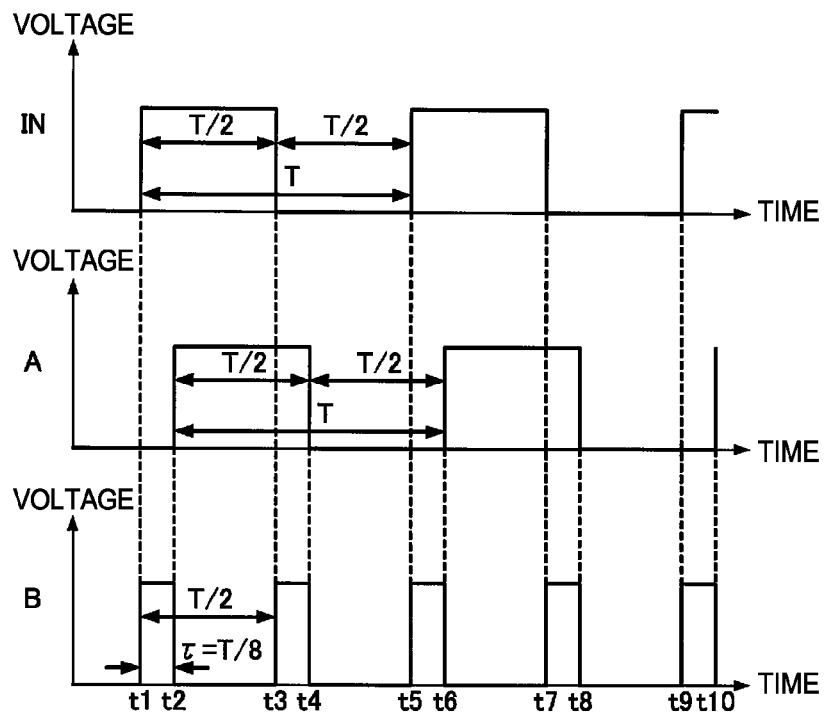
FIG. 2 is a graph schematically illustrating an example of a relationship between a clock signal and a time.

FIG. 2 is a graph schematically illustrating an example of a relationship between the clock signal and the time T. In order from above in FIG. 2, a waveform (clock signal) at the input terminal IN, a waveform at a node A which is an output node of the delay circuit 50, and a waveform at a node B which is an output node of the exclusive OR circuit 60 are represented. In each graph of FIG. 2, the horizontal axis represents a time, and the vertical axis represents a voltage.

In an example shown in FIG. 2, in the clock signal, pulses having a pulse width T/2 on the time axis are periodically arranged with a period T. In the example shown in FIG. 2, for example, a time from time t1 which is a signal rising timing to time t5 which is the next rising timing is one period. The pulse width T/2 is a length of a period in which a high-level voltage is set. In the example shown in FIG. 2, for example, a time from time t1 which is a signal rising timing to time t3 which is the next falling timing is the pulse width T/2.

In the example shown in FIG. 2, the length of the time $\tau$ which is a delay time in the delay circuit 50 is T/8, and the frequency multiplication circuit 1 is a circuit that multiplies a frequency by 2. Generally, when a frequency is multiplied by 2, the length of the time $\tau$ is set to T/4, but in the example shown in FIG. 2, the length of the time $\tau$ is made different from T/4. That is, in the 2-multiplication frequency multiplication circuit, a duty ratio (a duty ratio in the example shown in FIG. 2 is $\tau/(T/2)=(T/8)/(T/2)=0.25$) which is a proportion of a pulse width per period is made different from 0.5. In the frequency multiplication circuit according to the invention, the length of the time $\tau$ is appropriately selected, and thus it is possible to select a multiplication number. Meanwhile, the length of the time $\tau$ may be a length other than $n \times T/4$ (n is an integer).

The signal correction circuit 10 attenuates a signal having a second frequency based on T/2, rather than a signal having a first frequency based on the time $\tau$. The frequency characteristics (transmission characteristics) of the signal correction circuit 10 may be passband characteristics or band removal characteristics.

The signal having a first frequency based on the time $\tau$ is a signal in which $1/(2 \times t)$ is used as a first frequency. The signal having a second frequency based on T/2 is a signal in which 2/T is used as a second frequency.

Figure 3:
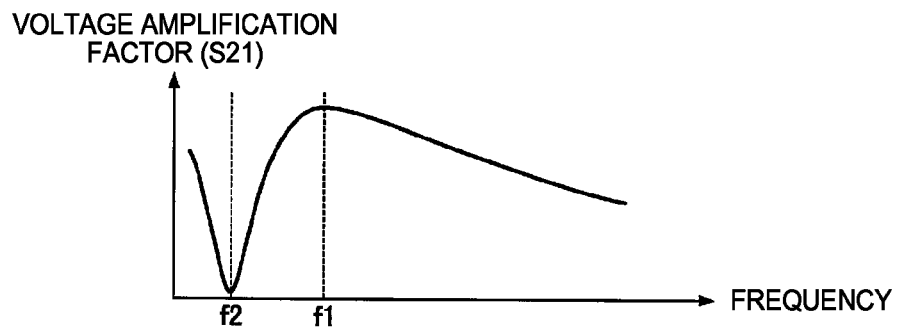
FIG. 3 is a graph illustrating transmission characteristics of a signal correction circuit.

FIG. 3 is a graph illustrating the transmission characteristics of the signal correction circuit 10. The horizontal axis of FIG. 3 represents a frequency, and the vertical axis represents a voltage amplification factor (S21). In an example shown in FIG. 3, the voltage amplification factor of the signal correction circuit 10 takes a maximum value at a frequency f1, and takes a minimum value at a frequency f2. The frequency f1 is a frequency equivalent to the parallel resonance frequency of the parallel resonance circuit which is constituted by the first inductor L1 and the second capacitance circuit C2. The frequency f2 is a frequency equivalent to the series resonance frequency of the first series circuit 11.

In the present embodiment, the frequency f1 is set to the first frequency equivalent to $1/(2\times\tau)=4/T$, and the frequency f2 is set to the second frequency equivalent to 2/T.

Figure 4:
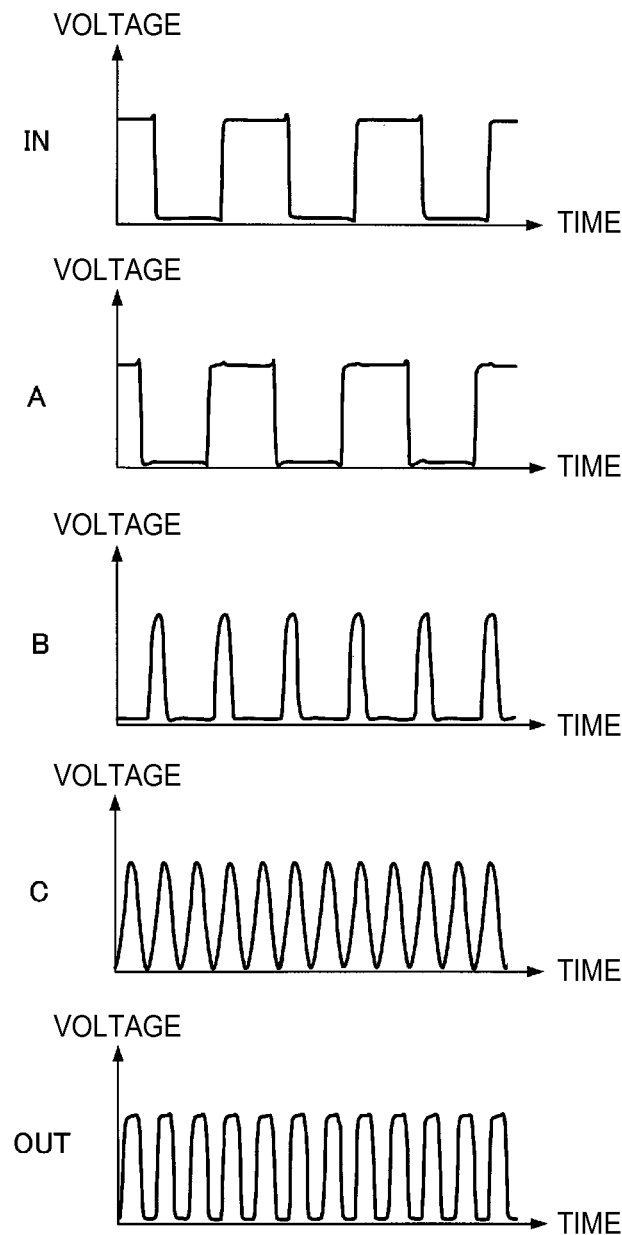
FIG. 4 is a graph illustrating waveform examples in the present embodiment.

FIG. 4 is a graph illustrating waveform examples in the present embodiment. In order from above in FIG. 4, a waveform at the input terminal IN, a waveform at the node A, a waveform at the node B, a waveform at a node C which is an output node of the signal correction circuit 10, and a waveform at the output terminal OUT are represented. In each graph of FIG. 4, the horizontal axis represents a time, and the vertical axis represents a voltage.

The waveform at the input terminal IN, the waveform at the node A, and the waveform at the node B in FIG. 4 show actions described using FIG. 2.

In an example shown in FIG. 4, at the node C, a component having a second frequency is attenuated, and a signal close to a sinusoidal wave having a first frequency appears. The waveform shaping circuit 20 shapes the signal of the node C, and thus a waveform obtained by multiplying the frequency of the waveform at the input terminal IN by 4 appears in the output terminal OUT.

According to the present embodiment, since the component having a second frequency which is an unnecessary frequency component is attenuated by the signal correction circuit 10, it is possible to obtain an output signal having a first frequency. That is, according to the present embodiment, among signals which are output from the 2-multiplication frequency multiplication circuit using the delay circuit 50 and the exclusive OR circuit 60, a signal having a frequency (second frequency) multiplied by 2 is attenuated, and a signal having a frequency (first frequency) based on the time τ is passed, thereby allowing the frequency multiplication circuit 1 capable of outputting a frequency other than that multiplied by 2 to be implemented. Therefore, it is possible to implement the frequency multiplication circuit 1 capable of multiplying a frequency with a simple configuration.

According to the present embodiment, since the signal having a second frequency can be attenuated, for example, by the series resonance frequency of the first series circuit 11 being set to the second frequency, it is possible to obtain the output signal having a first frequency. Therefore, it is possible to implement the frequency multiplication circuit 1 capable of multiplying a frequency with a simple configuration.

According to the present embodiment, since the signal having a first frequency can be passed, for example, by the parallel resonance frequencies of the first inductor L1 of the first series circuit 11 and the second capacitance circuit C2 being set to the first frequency, it is possible to obtain the output signal having a first frequency. Therefore, it is possible to implement the frequency multiplication circuit 1 capable of multiplying a frequency with a simple configuration.

1-2. Second Embodiment

Figure 5:
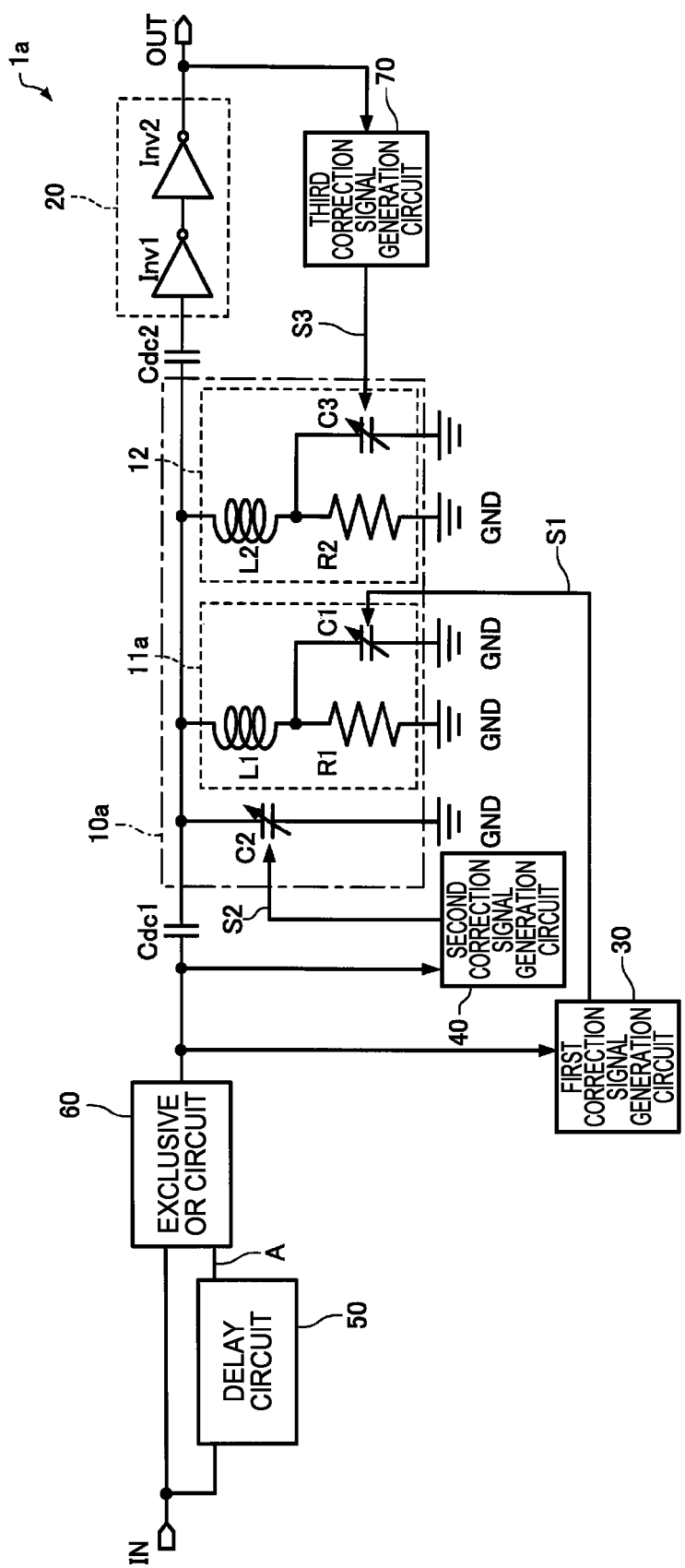
FIG. 5 is a circuit diagram of a frequency multiplication circuit according to a second embodiment.

FIG. 5 is a circuit diagram of a frequency multiplication circuit 1a according to a second embodiment. The same components as those shown in FIG. 1 are denoted by the same reference numerals and signs, and thus the detailed description thereof will not be given.

The frequency multiplication circuit 1a according to the present embodiment includes a signal correction circuit 10a, a first correction signal generation circuit 30, a second correction signal generation circuit 40, and a third correction signal generation circuit 70. The signal correction circuit 10a includes a first series circuit 11a.

A first capacitance circuit C1 of the frequency multiplication circuit 1a according to the present embodiment is constituted by a variable capacitance circuit having a variable capacitance value. In an example shown in FIG. 5, the first capacitance circuit C1 is configured to include a variable capacitive element. The first capacitance circuit C1 may be constituted by a capacitor array circuit having a variable capacitance value.

According to the present embodiment, since a frequency capable of being attenuated can be adjusted, it is possible to change the frequency characteristics (transmission characteristics) of the signal correction circuit 10a, for example, in accordance with the frequency of the clock signal. That is, even when the frequency of the clock signal to be input is changed, it is possible to easily adjust the frequency capable of being attenuated, for example, to a frequency of the clock signal to be input which is multiplied by 2. Therefore, it is possible to implement the frequency multiplication circuit 1a capable of multiplying a frequency with a simple configuration.

A second capacitance circuit C2 of the frequency multiplication circuit 1a according to the present embodiment is constituted by a variable capacitance circuit having a variable capacitance value. In the example shown in FIG. 5, the second capacitance circuit C2 is configured to include a variable capacitive element. The second capacitance circuit C2 may be constituted by a capacitor array circuit having a variable capacitance value.

According to the present embodiment, since a frequency capable of being passed can be adjusted, it is possible to change the frequency characteristics (transmission characteristics) of the signal correction circuit 10a, for example, in accordance with the length of the time τ. That is, even when a multiplied frequency is changed, it is possible to easily adjust the frequency capable of being passed, for example, to a multiplied frequency. Therefore, it is possible to implement the frequency multiplication circuit 1a capable of multiplying a frequency with a simple configuration.

The first correction signal generation circuit 30 generates a first control signal S1 based on T/2. The capacitance value of the first capacitance circuit C1 is controlled on the basis of the first control signal S1.

In the example shown in FIG. 5, a clock signal from an input terminal IN is input to the first correction signal generation circuit 30, and the first control signal S1 is output to the control terminal of the first capacitance circuit C1 so that the series resonance frequency of the first series circuit 11 becomes close to a frequency based on T/2.

According to the present embodiment, it is possible to change the frequency characteristics (transmission characteristics) of the signal correction circuit 10a in accordance with the frequency of the clock signal. That is, even when the frequency of the clock signal to be input is changed, it is possible to easily adjust the frequency capable of being attenuated, for example, to a frequency of the clock signal to be input which is multiplied by 2. Therefore, it is possible to implement the frequency multiplication circuit 1a capable of multiplying a frequency with a simple configuration.

The second correction signal generation circuit 40 generates a second control signal S2 based on the time τ. The capacitance value of the second capacitance circuit C2 is controlled on the basis of the second control signal S2.

In the example shown in FIG. 5, the clock signal from the input terminal IN is input to the second correction signal generation circuit 40, and the second control signal S2 is output to the control terminal of the second capacitance circuit C2 so that the parallel resonance frequency of the parallel resonance circuit constituted by the first inductor L of the first series circuit 11 and the second capacitance circuit C2 becomes close to a frequency based on the time width of the period T.

According to the present embodiment, it is possible to change the frequency characteristics of the signal correction circuit 10a in accordance with the length of the time τ. That is, even when a multiplied frequency is changed, it is possible to easily adjust the frequency capable of being passed, for example, to a multiplied frequency. Therefore, it is possible to implement the frequency multiplication circuit 1a capable of multiplying a frequency with a simple configuration.

Figure 6:
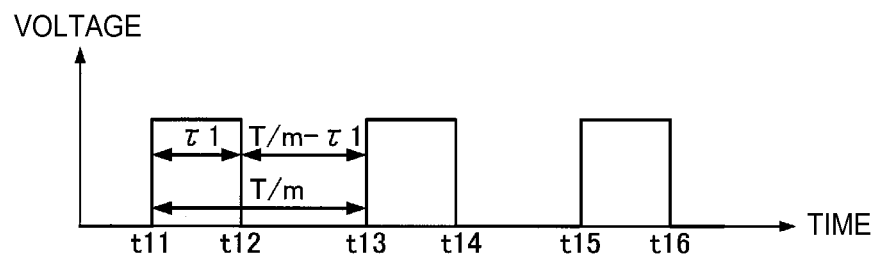
FIG. 6 is a graph schematically illustrating an example of an output signal of a frequency multiplication circuit.

FIG. 6 is a graph schematically illustrating an example of an output signal of the frequency multiplication circuit 1a. The horizontal axis of FIG. 6 represents a time, and the vertical axis represents a voltage.

In the output signal of the frequency multiplication circuit 1a (output signal of a waveform shaping circuit 20), pulses having a pulse width τ1 on the time axis are periodically arranged with a period T/m. Here, m is a multiplication number (m≠2 is a real number). In the present embodiment, 4-multiplication is used, and thus a relation of m=4 is established.

In an example shown in FIG. 6, for example, a time from time t11 which is a signal rising timing to time t13 which is the next rising timing is one period. The pulse width τ1 is a length of a period in which a high-level voltage is set. In the example shown in FIG. 6, for example, a time from time t11 which is a signal rising timing to time t12 which is the next falling timing is the pulse width τ1. A duty ratio D1 of the output signal is a proportion of the pulse width τ1 per period, and is represented by the following expression.

$D1 = \tau1 \times m/T$

The duty ratio is ideally 0.5, but often deviates from 0.5 in a real circuit. In the above-mentioned example, the output signal of the waveform shaping circuit 20 has been described, but the waveform shaping circuit 20 has a signal from the signal correction circuit 10a input thereto, and thus a similar output signal is also formed with respect to the output signal from the signal correction circuit 10a.

The signal correction circuit 10a includes a multiplication circuit portion (first series circuit 11 and second capacitance circuit C2 which is connected in parallel to the first series circuit) that multiplies the frequency of an input signal from an exclusive OR circuit 60, and a multiplication signal correction portion (second series circuit) that corrects the duty ratio of an output signal from the multiplication circuit portion. The second series circuit attenuates at least one of signals having a fourth frequency based on at least one of pulse widths τ1 and T/m−τ1 of the output signal of the waveform shaping circuit 20 on the time axis, rather than a signal having a third frequency based on T/m (m≠2).

The signal having a third frequency based on T/m is a signal in which m/T is set to the third frequency. The signal having a fourth frequency based on the time width of the pulse width τ1 is a signal in which 1/(2×τ1) is set to the fourth frequency. The signal having a fourth frequency based on the time width of T/m−τ1 is a signal in which 1/(2×(T/m−τ1)) is set to the fourth frequency.

According to the present embodiment, since a component having a fourth frequency which is an unnecessary frequency component is attenuated by the multiplication signal correction portion, it is possible to obtain an output signal having a third frequency which has an improvement in duty ratio. Therefore, it is possible to implement the frequency multiplication circuit 1a capable of improving a duty ratio with a simple configuration. Particularly, the first frequency and the third frequency are made to be the same as each other, and thus it is possible to obtain an output signal having a desired multiplication number which has an improvement in duty ratio.

The signal correction circuit 10a includes a second series circuit 12 constituted by a second inductor L2 and a third capacitance circuit C3 which is connected between a signal line through which a signal from the exclusive OR circuit 60 is transmitted and a reference potential. The second series circuit 12 is a serial resonance circuit having a series resonance frequency. In addition, the second series circuit 12 further includes a resistor R2 which is connected in parallel to the third capacitance circuit C3. The reference potential in the present embodiment is a ground potential GND. Meanwhile, the third capacitance circuit may be constituted by one or more electrostatic capacitive elements having a constant capacitance value or one or more variable capacitive elements having a variable capacitance, and may be configured by combining these elements.

According to the present embodiment, since the signal having a fourth frequency can be attenuated, for example, by the series resonance frequency of the second series circuit 12 being set to the fourth frequency, it is possible to obtain the output signal having a third frequency which has an improvement in duty ratio. That is, even when the duty ratio of the output signal from the multiplication circuit portion of the signal correction circuit 10a changes, it is possible to easily adjust the frequency capable of being attenuated, for example, to a frequency (fourth frequency) based on the pulse width τ1. Therefore, it is possible to implement the frequency multiplication circuit 1a capable of improving a duty ratio with a simple configuration.

The third capacitance circuit C3 of the frequency multiplication circuit 1a according to the present embodiment is constituted by a variable capacitance circuit having a variable capacitance value. In the example shown in FIG. 5, the third capacitance circuit C3 is configured to include a variable capacitive element. The third capacitance circuit C3 may be constituted by a capacitor array circuit having a variable capacitance value.

According to the present embodiment, since the frequency capable of being attenuated can be adjusted, it is possible to change the frequency characteristics (transmission characteristics) of the signal correction circuit 10a, for example, in accordance with a shift in the duty ratio of the output signal from the waveform shaping circuit 20 or the multiplication circuit portion of the signal correction circuit 10a. That is, even when the duty ratio of the output signal from the waveform shaping circuit 20 or the multiplication circuit portion of the signal correction circuit 10a changes, it is possible to easily adjust the frequency capable of being attenuated, for example, to the frequency (fourth frequency) based on the pulse width τ1. Therefore, it is possible to implement the frequency multiplication circuit 1a capable of improving a duty ratio with a simple configuration.

The third correction signal generation circuit 70 generates a third control signal S3 based on at least one of the pulse widths τ1 and T/m−τ1. The capacitance value of the third capacitance circuit C3 is controlled on the basis of the third control signal S3.

According to the present embodiment, it is possible to change the frequency characteristics (transmission characteristics) of the signal correction circuit 10a, in accordance with a shift in the duty ratio of the output signal of the waveform shaping circuit 20 or a shift in the duty ratio of the signal which is output from the multiplication circuit portion. That is, even when the duty ratio of the output signal of the waveform shaping circuit 20 or the duty ratio of the output signal from the multiplication circuit portion changes, it is possible to easily adjust a frequency capable of being attenuated, for example, to the frequency (fourth frequency) based on the pulse width τ1. Therefore, it is possible to implement the frequency multiplication circuit 1a capable of improving a duty ratio with a simple configuration.

In addition, in the second embodiment, it is also possible to exhibit the same effect as that in the first embodiment for the same reason.

1-3. Third Embodiment

Figure 7:
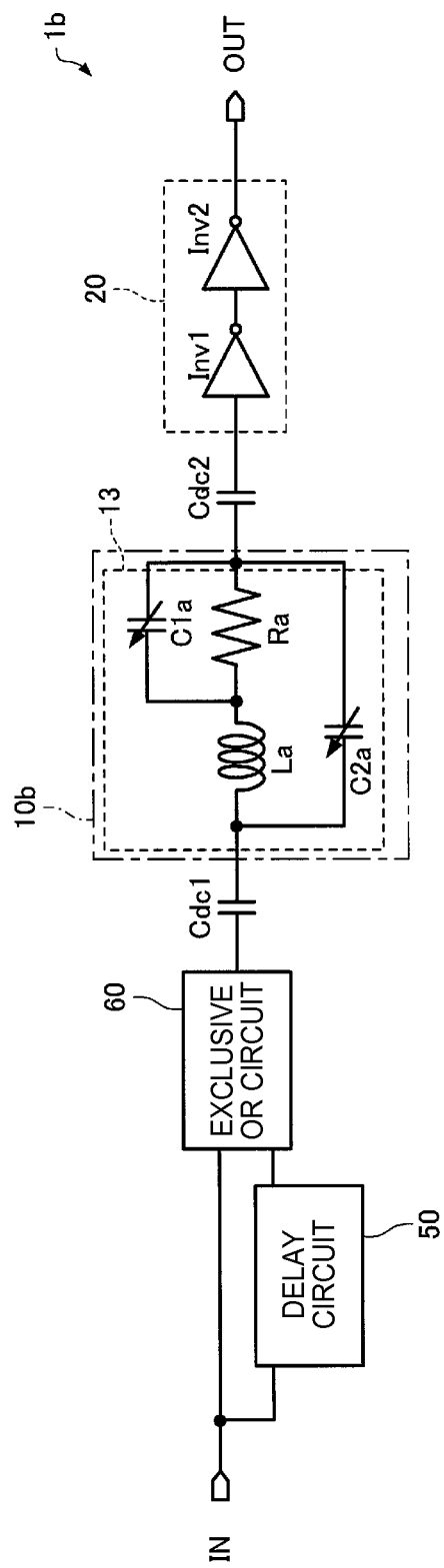
FIG. 7 is a circuit diagram of a frequency multiplication circuit according to a third embodiment.

FIG. 7 is a circuit diagram of a frequency multiplication circuit 1b according to a third embodiment. The same components as those shown in FIG. 1 are denoted by the same reference numerals and signs, and thus the detailed description thereof will not be given.

The frequency multiplication circuit 1b according to the present embodiment includes a signal correction circuit 10b. The signal correction circuit 10b includes a filter circuit 13 that passes a signal having a first frequency and attenuates a signal having a second frequency. The frequency characteristics (transmission characteristics) of the filter circuit 13 may be passband characteristics or band removal characteristics. Meanwhile, the filter circuit 13 is not limited to the above-mentioned configuration, and, for example, a SAW filter using a SAW resonator, a transversal-type SAW filter, a quartz crystal filter using a quartz crystal resonator, a ceramic filter using a ceramic resonator, a MEMS filter using a MEMS (Micro Electro Mechanical Systems) resonator, or the like may be used.

In an example shown in FIG. 7, the filter circuit 13 includes a serial resonance circuit constituted by an inductor La and a first capacitance circuit C1a which is connected into a signal path through which a signal is transmitted. The inductor La and the first capacitance circuit C1a constitute a serial resonance circuit having a series resonance frequency. In addition, the filter circuit 13 further includes a resistor Ra which is connected in parallel to the first capacitance circuit C1a. In addition, the filter circuit 13 further includes a second capacitance circuit C2a which is connected in parallel to the above-mentioned serial resonance circuit. The inductor La and the second capacitance circuit C2a constitute a parallel resonance circuit having a parallel resonance frequency. The first capacitance circuit C1a and the second capacitance circuit C2a may be constituted by a variable capacitance circuit having a variable capacitance value.

According to the present embodiment, since the signal having a second frequency can be attenuated, for example, by the parallel resonance frequency of the filter circuit 13 being set to the second frequency, it is possible to obtain an output signal having a first frequency. That is, among signals which are output from the 2-multiplication frequency multiplication circuit using a delay circuit 50 and an exclusive OR circuit 60, a signal having a frequency (second frequency) multiplied by 2 is attenuated, and a signal having a frequency (first frequency) based on the time τ is passed, thereby allowing the frequency multiplication circuit 1b capable of outputting a frequency other than that multiplied by 2 to be implemented. Therefore, it is possible to implement the frequency multiplication circuit 1b capable of multiplying a frequency with a simple configuration.

According to the present embodiment, since the signal having a first frequency can be passed, for example, by the series resonance frequency of the filter circuit 13 being set to the first frequency, it is possible to obtain the output signal having a first frequency. Therefore, it is possible to implement the frequency multiplication circuit 1b capable of multiplying a frequency with a simple configuration.

In addition, in the third embodiment, it is also possible to exhibit the same effect as that in the first embodiment and the second embodiment for the same reason.

2. Electronic Device

Figure 8:
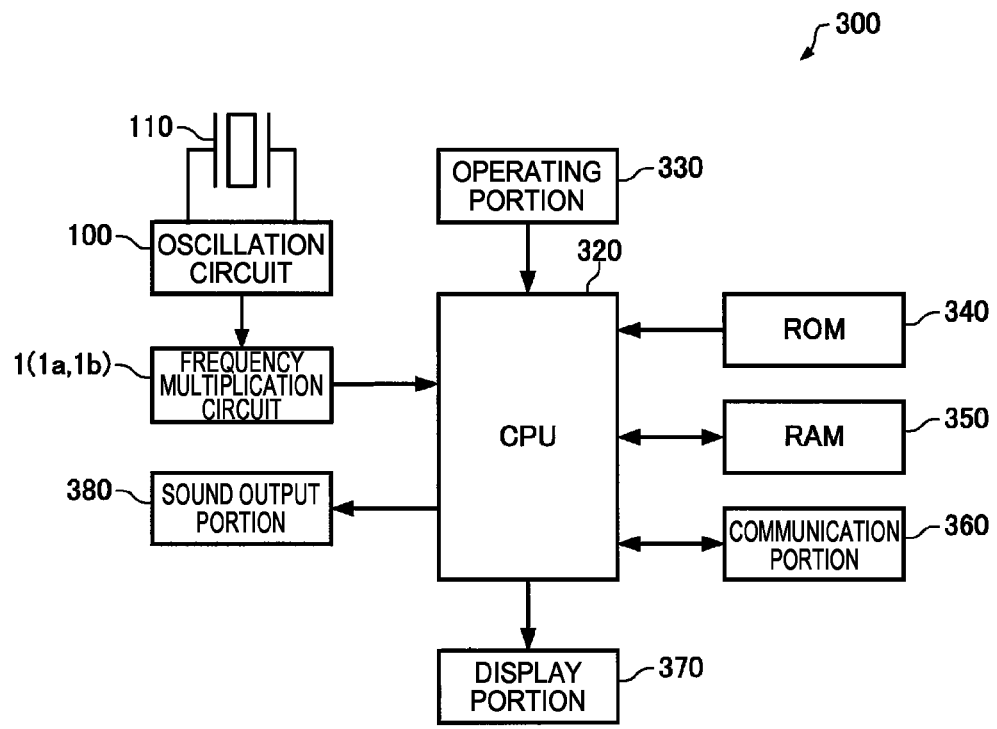
FIG. 8 is a functional block diagram of an electronic device according to the present embodiment.

FIG. 8 is a functional block diagram of an electronic device 300 according to the present embodiment. Meanwhile, the same components as those in each embodiment described above are denoted by the same reference numerals and signs, and thus the detailed description thereof will not be given.

The electronic device 300 according to the present embodiment is the electronic device 300 including the frequency multiplication circuit 1, the frequency multiplication circuit 1a or the frequency multiplication circuit 1b. In the example shown in FIG. 7, the electronic device 300 is configured to include the frequency multiplication circuit 1, an oscillation circuit 100, a vibrator 110, a CPU (Central Processing Unit) 320, an operating portion 330, a ROM (Read Only Memory) 340, a RAM (Random Access Memory) 350, a communication portion 360, a display portion 370, and a sound output portion 380. Meanwhile, the electronic device 300 according to the present embodiment may have a configuration in which some of the components (respective portions) shown in FIG. 7 are omitted or changed, or other components are added.

The oscillation circuit 100 and the vibrator 110 generate an oscillation signal. The oscillation circuit 100 supplies the oscillation signal to the frequency multiplication circuit 1.

The frequency multiplication circuit 1 multiplies a frequency using the oscillation signal from the oscillation circuit 100 as a clock signal, and supplies an output signal to not only the CPU 320 but also respective portions (not shown).

The CPU 320 performs various types of computation processes and control processes using the output signal of the frequency multiplication circuit 1 as a clock pulse, in accordance with a program which is stored in the ROM 340 or the like. Specifically, the CPU 320 performs various types of processes in response to an operation signal from the operating portion 330, a process of controlling the communication portion 360 in order to perform data communication with the outside, a process of transmitting a display signal for causing the display portion 370 to display a variety of information, a process of causing the sound output portion 380 to output various types of sounds, and the like.

The operating portion 330 is an input device constituted by operation keys, button switches or the like, and outputs an operation signal in response to a user's operation to the CPU 320.

The ROM 340 stores a program, data or the like for causing the CPU 320 to perform various types of computation processes and control processes.

The RAM 350 is used as a work area of the CPU 320, and temporarily stores a program and data which are read out from the ROM 340, data which is input from the operating portion 330, arithmetic operation results executed by the CPU 320 in accordance with various types of programs, and the like.

The communication portion 360 performs a variety of controls for establishing data communication between the CPU 320 and an external device.

The display portion 370 is a display device which is constituted by an LCD (Liquid Crystal Display), an electrophoretic display, or the like, and displays a variety of information on the basis of a display signal which is input from the CPU 320.

The sound output portion 380 is a device, such as a speaker, which outputs sound.

According to the electronic device 300 of the present embodiment, since the electronic device includes the frequency multiplication circuit 1, the frequency multiplication circuit 1a or the frequency multiplication circuit 1b which is capable of multiplying a frequency with a simple configuration, it is possible to implement the electronic device 300 with a simple configuration.

As the electronic device 300, various electronic devices may be considered. For example, the electronic device includes a personal computer (for example, mobile-type personal computer, laptop personal computer, or tablet personal computer), a mobile terminal such as a cellular phone, a digital still camera, an ink jet ejecting apparatus (for example, ink jet printer), a storage area network device such as a router or a switch, a local area network device, a device for a mobile terminal and a base station, a television, a video camera, a video recorder, a car navigation device, a pager, a real-time clock device, an electronic notebook (also including a communication function), an electronic dictionary, an electronic calculator, an electronic game console, a game controller, a word processor, a workstation, a TV phone, a security TV monitor, electronic binoculars, a POS (point of sale) terminal, medical instruments (for example, electronic thermometer, sphygmomanometer, blood glucose monitoring system, electrocardiogram measurement device, ultrasound diagnostic device, and electronic endoscope), a fish finder, various types of measuring apparatuses, meters and gauges (for example, meters and gauges of a vehicle, an airplane, and a ship), a flight simulator, a head mounted display, a motion tracer, a motion tracker, a motion controller, a PDR (walker position and direction measurement), an oscillator, and the like.

Figure 9:
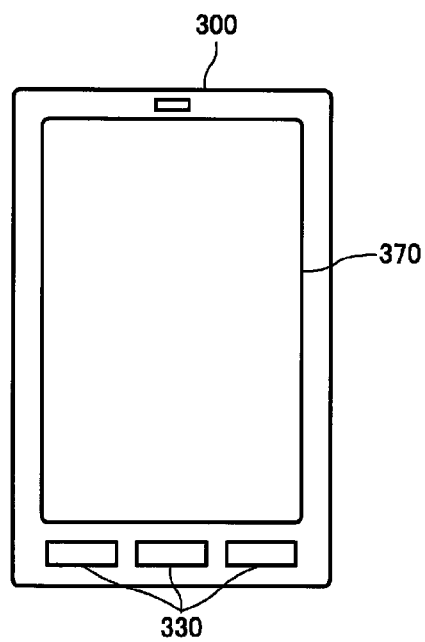
FIG. 9 is a diagram illustrating an example of the appearance of a smartphone which is an example of an electronic device.

FIG. 9 is a diagram illustrating an example of the appearance of a smartphone which is an example of the electronic device 300. The smartphone which is the electronic device 300 includes buttons as the operating portion 330, and includes an LCD as the display portion 370. The smartphone which is the electronic device 300 includes the frequency multiplication circuit 1, the frequency multiplication circuit 1a or the frequency multiplication circuit 1b which is capable of multiplying a frequency with a simple configuration, and thus it is possible to implement the electronic device 300 with a simple configuration.

3. Moving Object

Figure 10:
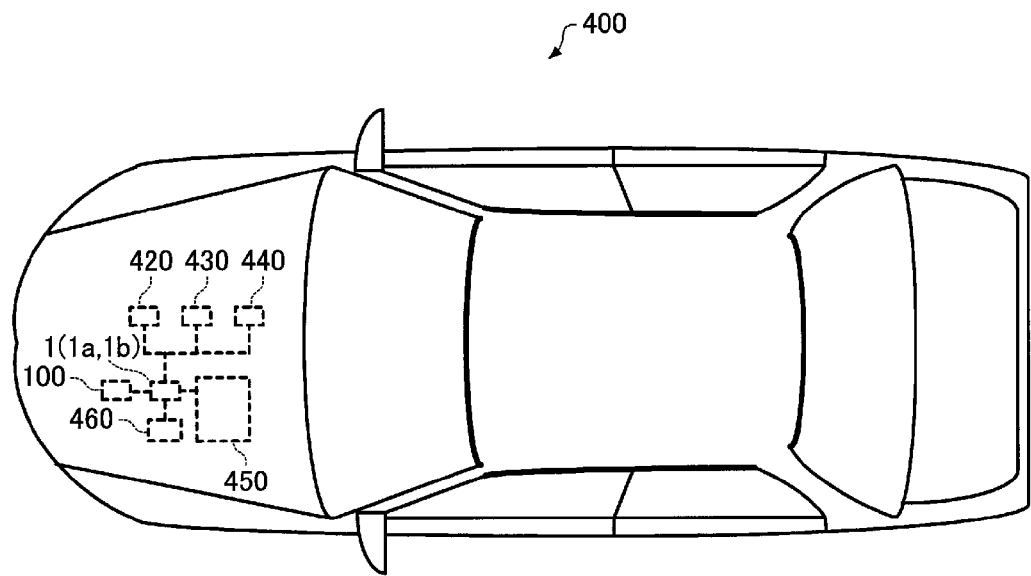
FIG. 10 is a diagram (top view) illustrating an example of a moving object according to the present embodiment.

FIG. 10 is a diagram (top view) illustrating an example of a moving object 400 according to the present embodiment. Meanwhile, the same components as those in each embodiment described above are denoted by the same reference numerals and signs, and thus the detailed description thereof will not be given.

The moving object 400 according to the present embodiment is the moving object 400 including the frequency multiplication circuit 1, the frequency multiplication circuit 1a or the frequency multiplication circuit 1b. FIG. 10 shows the moving object 400 configured to include the frequency multiplication circuit 1 that outputs an output signal to each component on the basis of a clock signal which is output by the oscillation circuit 100. In addition, in an example shown in FIG. 10, the moving object 400 is configured to include a controller 420, a controller 430, and a controller 440 that perform a variety of controls of an engine system, a braking system, a keyless entry system and the like, a battery 450 and a battery 460 for backup. Meanwhile, the moving object 400 according to the present embodiment may have a configuration in which some of the components (respective portions) of FIG. 10 are omitted or changed, and may have a configuration in which other components are added.

According to the moving object 400 of the present embodiment, the moving object includes the frequency multiplication circuit 1, the frequency multiplication circuit 1a or the frequency multiplication circuit 1b which is capable of multiplying a frequency with a simple configuration, and thus it is possible to implement the moving object 400 with a simple configuration.

Various moving objects may be considered as such a moving object 400. The moving object includes, for example, an automobile (also including an electric automobile), an aircraft such as a jet engine airplane or a helicopter, a ship, a rocket, a satellite, and the like.

As described above, the embodiments or modification examples have been described, but the invention is not limited to these embodiments or modification examples, and can be implemented in various aspects without departing from the scope of the invention.

The invention includes configurations (for example, configurations having the same functions, methods and results, or configurations having the objects and effects) which are substantially the same as the configurations described in the embodiments. In addition, the invention includes configurations in which non-essential elements of the configurations described in the embodiments are replaced. In addition, the invention includes configurations exhibiting the same operations and effects as, or configurations capable of achieving the same objects as, the configurations described in the embodiments. In addition, the invention includes configurations in which known techniques are added to the configurations described in the embodiments.

The entire disclosure of Japanese Patent Application No. 2014-149606, filed Jul. 23, 2014 is expressly incorporated by reference herein.

What is claimed is:

1. A frequency multiplication circuit comprising:
a delay circuit that outputs a delayed signal obtained by delaying a phase of a clock signal;

an exclusive OR circuit that outputs a signal obtained by performing an exclusive OR between the clock signal and the delayed signal; and a signal correction circuit that has a signal from the exclusive OR circuit input thereto, outputs a required frequency component by correcting the input signal, and includes a series resonance circuit having a series resonance frequency and a parallel resonance circuit having a parallel resonance frequency, wherein the series resonance circuit and the parallel resonance circuit share at least one circuit element.

2. A frequency multiplication circuit comprising:

a delay circuit that has a clock signal having a period T input thereto, and outputs a signal obtained by delaying a phase of the clock signal by a time τ;

an exclusive OR circuit that outputs a signal obtained by performing an exclusive OR between the clock signal and the delayed signal; and a signal correction circuit that has a signal from the exclusive OR circuit input thereto, outputs a required frequency component by correcting the input signal, and attenuates an unnecessary frequency component, wherein a length of the time t is a length other than n×T/4 (n is an integer), and the signal correction circuit attenuates a signal having a second frequency based on T/2, rather than a signal having a first frequency based on the time τ.

3. The frequency multiplication circuit according to claim 2, wherein the signal correction circuit includes a filter circuit that passes the signal having a first frequency and attenuates the signal having a second frequency.

4. A frequency multiplication circuit comprising:

a delay circuit that has a clock signal having a period T input thereto, and outputs a signal obtained by delaying a phase of the clock signal by a time τ;

an exclusive OR circuit that outputs a signal obtained by performing an exclusive OR between the clock signal and the delayed signal; and a signal correction circuit that has a signal from the exclusive OR circuit input thereto, outputs a required frequency component by correcting the input signal, and attenuates an unnecessary frequency component, wherein the signal correction circuit includes a first series circuit, having a first inductor and a first capacitance circuit connected in series to each other, which is connected between a signal line through which the signal from the exclusive OR circuit is transmitted and a reference potential.

5. The frequency multiplication circuit according to claim 4, wherein the first capacitance circuit includes a variable capacitive element.

6. The frequency multiplication circuit according to claim 4, further comprising a first correction signal generation circuit that generates a first control signal based on T/2, wherein a capacitance value of the first capacitance circuit is controlled on the basis of the first control signal.

7. The frequency multiplication circuit according to claim 4, further comprising a second capacitance circuit which is connected in parallel to the first series circuit.

8. The frequency multiplication circuit according to claim 7, wherein the second capacitance circuit includes a variable capacitive element.

9. The frequency multiplication circuit according to claim 4, further comprising a second correction signal generation circuit that generates a second control signal based on the time τ, wherein a capacitance value of the second capacitance circuit is controlled on the basis of the second control signal.

10. A frequency multiplication circuit comprising:

a delay circuit that has a clock signal having a period T input thereto, and outputs a signal obtained by delaying a phase of the clock signal by a time τ;

an exclusive OR circuit that outputs a signal obtained by performing an exclusive OR between the clock signal and the delayed signal;

a signal correction circuit that has a signal from the exclusive OR circuit input thereto, outputs a required frequency component by correcting the input signal, and attenuates an unnecessary frequency component; and a waveform shaping circuit that shapes a signal from the signal correction circuit, wherein the signal correction circuit includes a multiplication signal correction portion, and the multiplication signal correction portion is supplied with a signal in which pulses having a pulse width τ1 on a time axis are periodically arranged with a period T/m (m≠2), and the pulse width τ1 and the period T/m satisfy a relation of τ1/(T/m)≠0.5, and attenuates at least one of signals having a fourth frequency based on at least one of the pulse width τ1 and a pulse width T/m−τ1, rather than a signal having a third frequency based on the period T/m (m≠2).

11. The frequency multiplication circuit according to claim 10, wherein the multiplication signal correction portion includes a second series circuit, having a second inductor and a third capacitance circuit connected in series to each other, which is connected between a signal line through which the signal from the exclusive OR circuit is transmitted and a reference potential.

12. The frequency multiplication circuit according to claim 11, wherein the third capacitance circuit includes a variable capacitive element.

13. The frequency multiplication circuit according to claim 12, further comprising a third correction signal generation circuit that generates a third control signal based on at least one of the pulse widths τ1 and T/m−τ1, wherein a capacitance value of the third capacitance circuit is controlled on the basis of the third control signal.

14. A system comprising:

an electronic device comprising the frequency multiplication circuit according to claim 1.

15. A system comprising:

a moving object comprising the frequency multiplication circuit according to claim 1.

16. The frequency multiplication circuit according to claim 1, wherein the at least one circuit element comprises an inductor.

* * * * *